United States Patent [19]

Woodward

[11] 4,075,549
[45] Feb. 21, 1978

[54] APPARATUS AND METHOD FOR TESTING ELECTRICAL SURGE ARRESTERS

[75] Inventor: Roger P. Woodward, Atlanta, Ga.

[73] Assignee: GW Electronics, Inc., Atlanta, Ga.

[21] Appl. No.: 691,218

[22] Filed: June 1, 1976

[51] Int. Cl.² .............................................. G01R 31/02
[52] U.S. Cl. ...................................... 324/28 R; 324/54
[58] Field of Search .................. 324/54, 28 R, 28 CR, 324/72

[56] References Cited

U.S. PATENT DOCUMENTS 3,970,924   7/1976   Pendleton .............................. 324/54

OTHER PUBLICATIONS

H. Linck, Lightning Arrester Field Test Equipment, Paper 59-216, Oct. 1959, pp. 890-895.

Primary Examiner—M. Tokar
Attorney, Agent, or Firm—Robert B. Kennedy

[57] ABSTRACT

An electrical surge arrester tester comprising two surge arrester test leads and a voltage generator for generating and applying DC voltage of continuously increasing magnitudes to the surge arrester test leads. A monitor is provided for continuously and simultaneously monitoring the magnitude of DC voltages being applied to, and the current being conducted across, the surge arrester test leads. A counter is provided for digitally recording the monitored firing voltage when the monitored current exceeds a preselected magnitude. A terminator circuit is provided for terminating the generation and application of voltage by the voltage generator upon recording of the firing voltage. A digital display is also provided for displaying the digitally recorded firing voltage.

A method of testing an electrical surge arrester comprising the steps of applying DC voltages of continuously increasing magnitudes to a surge arrester; monitoring the continuously increasing voltages being applied to the surge arrester while simultaneously monitoring the current being conducted therethrough; sequentially entering the monitored increasing magnitudes of voltage into a digital memory; detecting a surge of current through the surge arrester and in response thereto reducing the magnitude of voltage being applied to the surge arrester, and displaying the voltage entered into digital memory at the time of detected surge current through the surge arrester.

9 Claims, 4 Drawing Figures

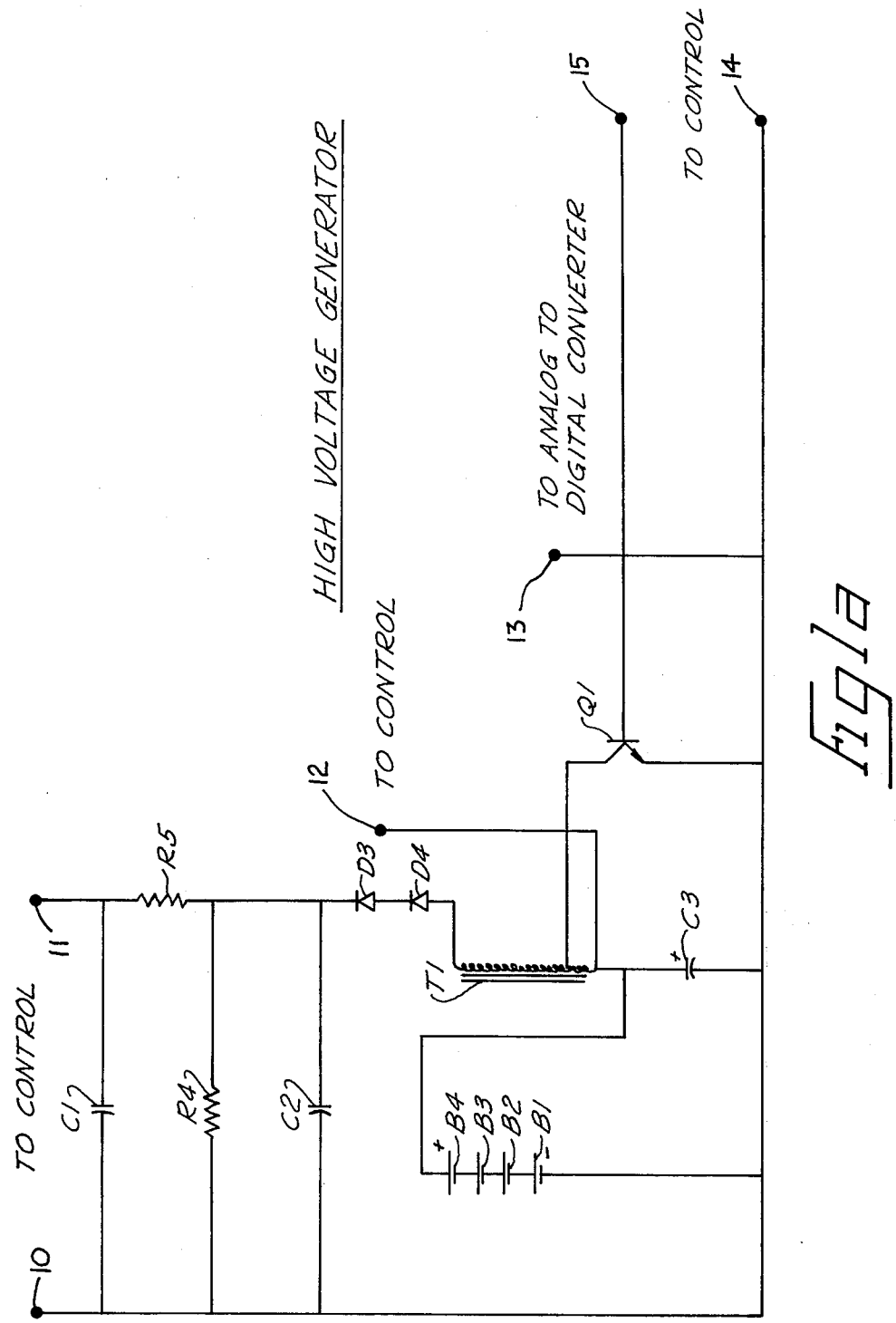

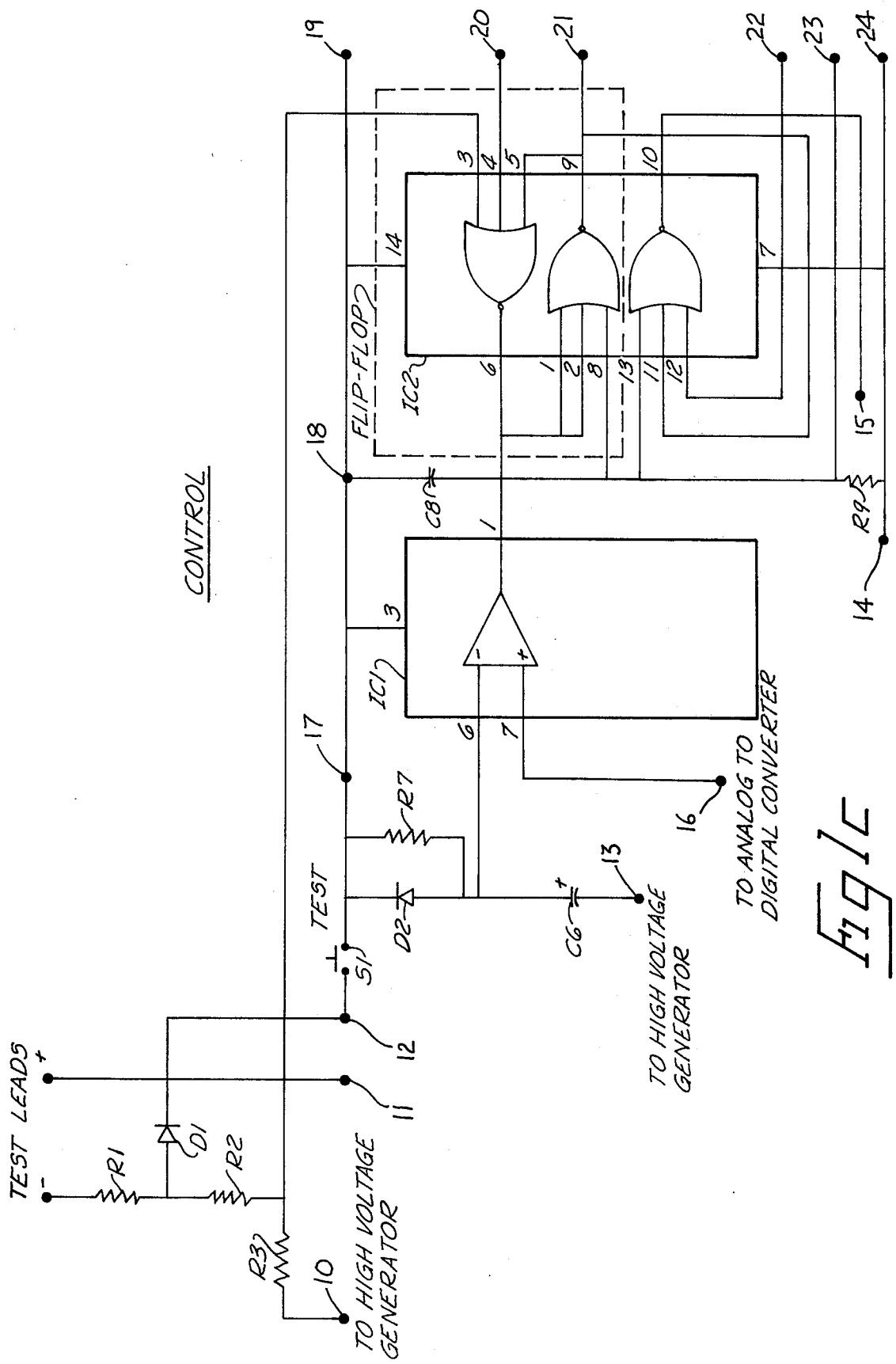

APPARATUS AND METHOD FOR TESTING ELECTRICAL SURGE ARRESTERS

BACKGROUND OF THE INVENTION

This invention relates generally to means and methods for testing electrical surge arresters.

Many types of electrical equipment, particularly exteriorly located equipment such as that used in he telephone and communications industries, are particularly susceptible to damage by surges of high current like that associated with atmospheric lightning. To protect such equipment from electrical surges, arresters are often placed upon the equipment to shunt any such surges away therefrom.. A common type of surge arrester comprises a gas discharge tube which, upon ionization of the gas by the application thereto of high voltage, becomes conductive and thereby shunts the electrical surge arrester. Another form of surge arrester, which typically is used in the telephone industry, utilizes carbon blocks for such breakdown and bypass circuit switching purposes.

With the passage of time surge arresters of the type described may deteriorate and become unreliable. To insure the safety of the equipment it therefore becomes necessary and prudent periodically to test the surge arresters to insure that they are functioning properly by becoming conductive upon the application of voltages within a selected voltage range. Heretofore, surge arresters have typically been tested by the application of voltages thereto of increasing magnitudes until breakdown or firing of the surge arrester occurs. Once breakdown occurs the application of voltage is continued to deflect a moving coil over a scale to enable a reading to be observed by a tester. Once this reading is visually made voltage is removed from the arrester.

Though prior art test devices of the type described have provided basic means for testing surge arresters, they have not been without distinct disadvantage. For example, in order to cause their moving coil to stabilize for visual readings they have required repetitive firings of the arresters under test. Such repetitive firings can themselves be destructive of the arrester. This is particularly true in the communications industry in which the arresters typically utilize carbon blocks. Furthermore, since the tester moving coils inherently reflect voltages indicative of residual ionization present during repetitive firing, they typically indicate a voltage somewhat lower than that of actual firing voltages. The devices have thus been generally inaccurate, often injurious to the very devices they are designed to test, and susceptible to human error in visually reading the indicated firing voltages.

Accordingly, it is a general object of the present invention to provide improved means and methods for testing electrical surge arresters.

More specifically, it is an object of the present invention to provide means and methods for testing surge arresters which require but a single firing of the arrester during test operations.

Another object of the invention is to provide means and methods for testing surge arresters of improved accuracy over those of the prior art.

Another object of the invention is to provide means and methods for testing surge arresters that are capable of digitally displaying firing voltages.

Yet another object of the invention is to provide means and methods for testing surge arresters employing portable power supplies and which include means for self-testing the tester's own power supply.

SUMMARY OF THE INVENTION

In one form of the invention an electrical surge arrester tester is provided comprising two surge arrester test leads and voltage generating means for generating and applying DC voltages of continuously increasing magnitudes to the surge arrester test leads. Means are provided for continuously and simultaneously monitoring the magnitudes of the DC voltage being applied to, and the current being conducted across, the arrester test leads. Counter means are provided for digitally recording the firing voltage monitored by the monitoring means when the current monitored by the monitoring means exceeds a preselected magnitude. Means are provided for terminating the application of voltage by the voltage generated means upon recording of the firing voltage. Display means are also provided for displaying the digitally recorded firing voltage.

In another form of the invention, a method is provided for testing an electrical surge arrester comprising the steps of applying voltages of continuously increasing magnitudes to a surge arrester, monitoring the continuously increasing magnitudes of voltage being applied to the surge arrester while simultaneously monitoring the magnitude of current being conducted therethrough, sequentially entering the monitored increasing magnitudes of voltage into a digital memory, detecting a surge of current through the surge arrester and in response thereto reducing the magnitude of voltage being applied to the surge arrester, and displaying the voltage entered into the digital memory substantially at the time of detected surge current through the surge arrester.

BRIEF DESCRIPTION OF THE DRAWING

FIGS. 1a–1d are schematic diagrams of a surge arrester tester embodying principles of the invention in a preferred form and which may be used in practicing methods of the invention.

DESCRIPTION OF THE PREFERRED EMBODIMENTS

Figure 1B:
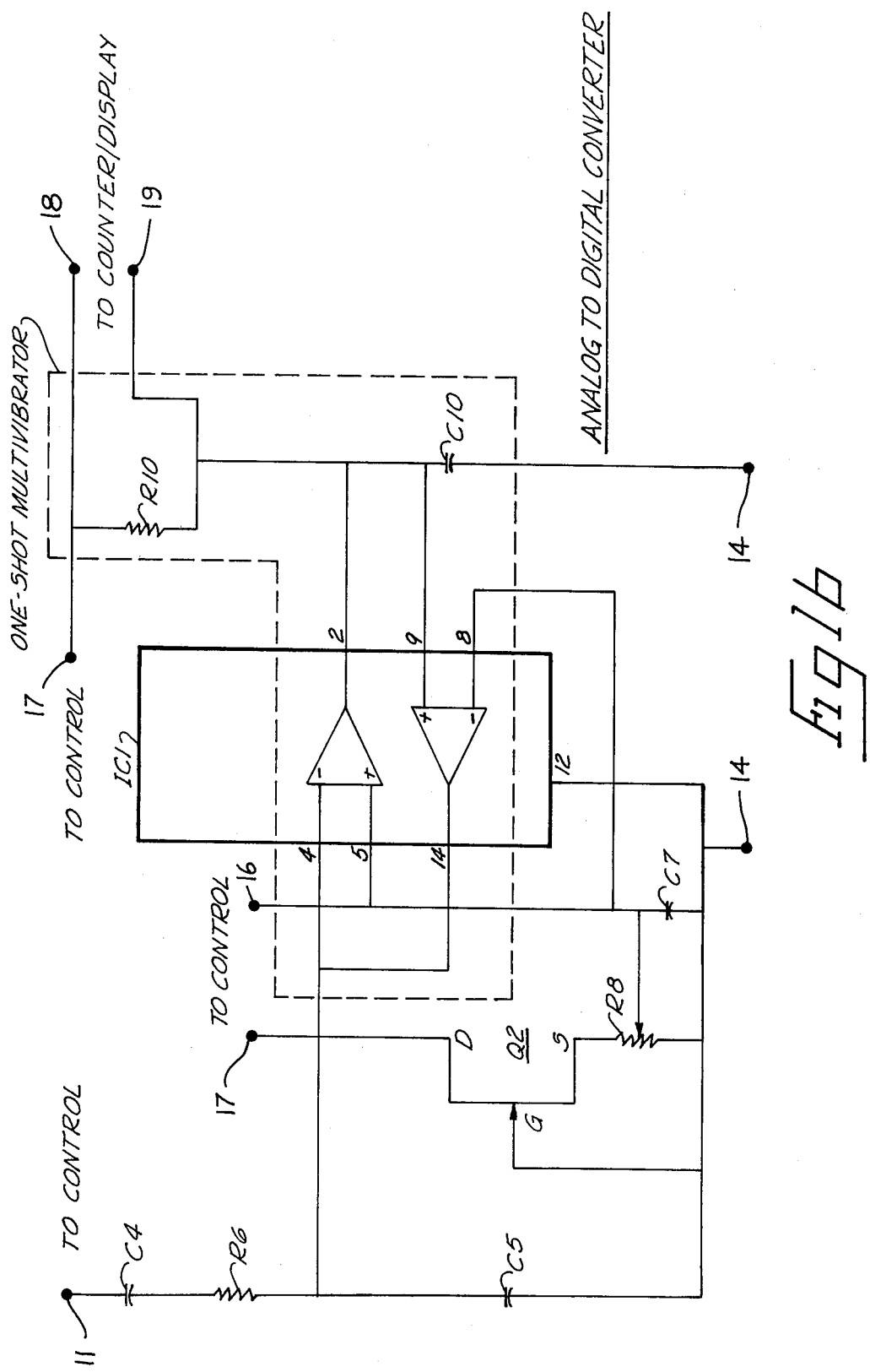
Figure 4:
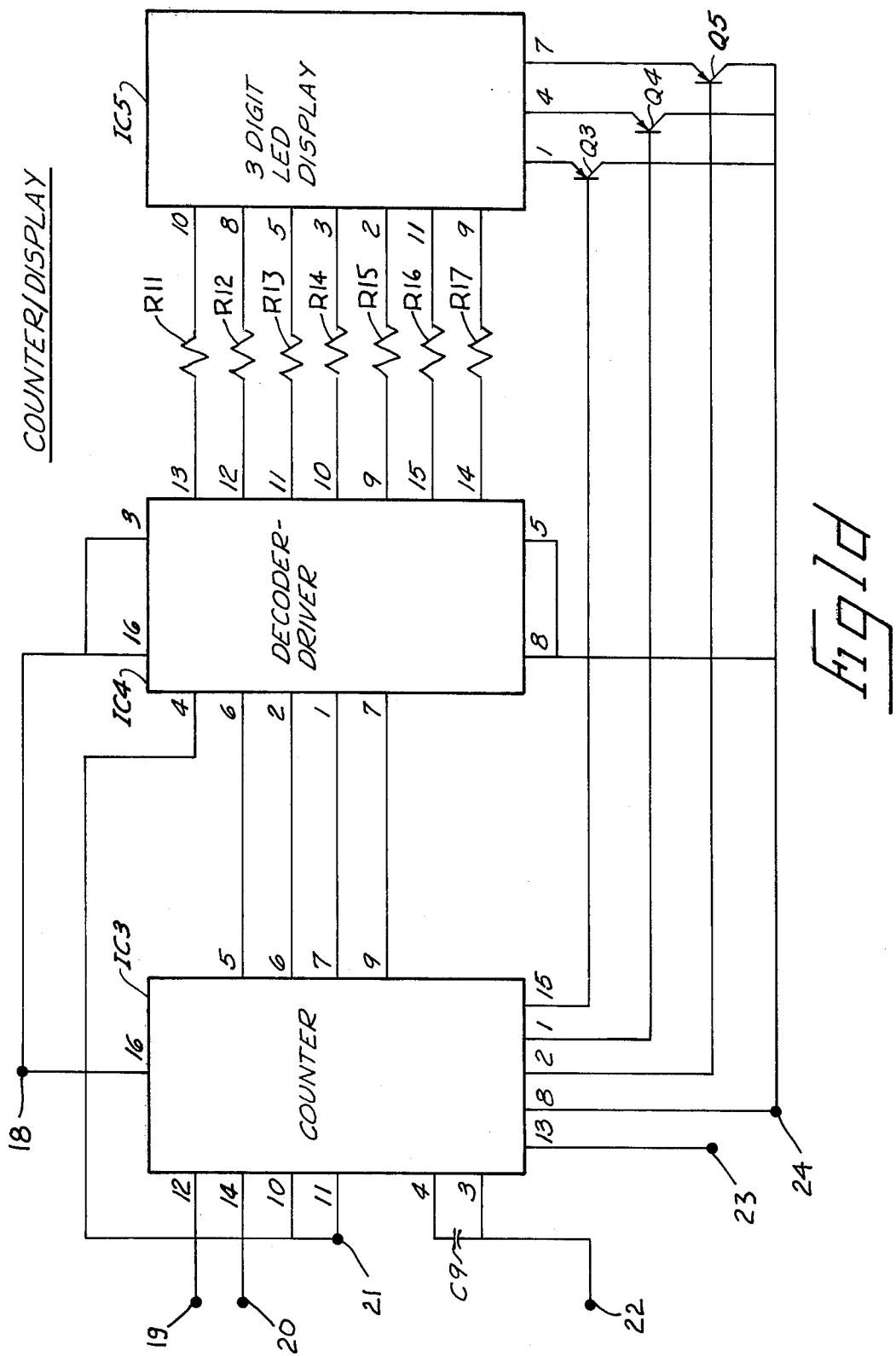

The drawing is a single figure of a circuit diagram schematically illustrating a surge arrester tester according to the present invention which figure has been segmented onto four sheets for clarity with common points on the circuit diagram between the various sheets schematically indicated by common pin numbers. With reference now in detail to the drawing the tester is seen to comprise four subassemblies consisting of the high voltage generator shown in FIG. 1a, the analog to digital converter shown in FIG. 1b, the control circuit shown in FIG. 1c, and the counter/display shown in FIG. 1d. The high voltage generator has a bank of serially connected batteries B1, B2, B3 and B4 and a capacitor C3 connected thereacross. The positive terminal of the battery bank is connected to the primary winding of a step-up, fly-back transformer T1. The primary winding is also connected to the control circuit through pins 12 and 14 through switching transistor Q1. Transistor Q1 itself is controlled by connection to the control circuit through pin 15. The secondary winding of transformer T1 is connected to the surge arrester test lead 11 through a pair of serially connected, half wave rectifying diodes D3 and D4, and resistor R5. The negative terminal of the battery bank is connected to a floating ground line extending between pin 14 and the other surge arrester test lead 10. A storage capacitor C2 is connected across the test leads through resistor R5 as is a resistor R4 which serves to discharge the circuit once it is de-energized. Another capacitor C1 is connected directly across the test leads and, in combination with resistor R5, provides a low pass filter or integrator.

With reference next to FIG. 1b, the analog to digital converter seen to include a portion of an integrated circuit IC1, which in circuit with a capacitor C10 and resistor R10 form a functional one-shot multivibrator. Pin 12 of IC1 and capacitor C10 of the multivibrator circuit are each connected to the high voltage generator at pin 14. The multivibrator is also connected to the control at pin 17 and to the counter/display at pins 18 and 19. In addition to the one-shot multivibrator, the analog digital converter also includes a reference voltage circuit comprising a field effect transistor Q2 and variable resistor R8 serially connected to pin 14 and the high voltage generator, and to pin 17 and the control circuit. A capacitor C7 couples pin 14 of the high voltage generator and variable resistor R8 with pin 16 and the control circuit. The converter also includes a circuit comprising capacitor C4, resistor R6 and capacitor C5 serially connecting test lead 11 and the control with pin 14, which circuit is hereinafter described in more detail.

The control unit illustrated in FIG. 1c is seen to include another portion of integrated circuit IC1 which is connected with a portion of another integrated circuit IC2 that functions as a flip-flop. Pin 3 of IC1 and pin 14 of IC2 are connected to the negative test lead through arrester test switch S1, a diode D1 and a resistor R1. Pin 3 of IC2 is connected to high voltage generator at pin 10 through resistor R3 and with the negative test lead through resistors R2 and R1. Pin 6 of IC1 is connected through capacitor C6 to the high voltage generator at pin 13 and through diode D2 to the arrester test switch S1 with resistor R7 in parallel with the diode. Integrated circuit IC2 is also connected to the counter/display shown in FIG. 1d which includes another integrated circuit IC3 that functions as a counter, an integrated circuit IC4 that functions as a decoder-driver, and an integrated circuit IC5 that functions as a multiplexed three-digit light emitting diode display. The counter/display is of conventional design and is adapted to count pulses from the analog to digital converter at pin 19. It counts as long as the count enable line, pin 11 of IC3, is low. The counter has digital multiplexing capabilities to drive the LED display. IC4 conventionally performs a BCD seven-segment conversion while transistors Q3, Q4 and Q5 drive the display.

In general operation, the two test leads shown in FIG. 1c are connected across a surge arrester to be tested and the tester itself energized whereupon voltage is applied to the test leads of magnitudes smoothly increasing in time from zero. The tester simultaneously measures the voltage applied to the arrester as well as the current conducted by it. When the current drawn by the arrester exceeds a predetermined amount, 200 microamperes for example, the tester records the applied voltage at that time and then terminates the application of voltage to the test leads. The recorded voltage is stored in a digital memory of the converter and displayed to a user on the digital display. This displayed voltage is the firing or breakdown voltage of the arrester under test which is numerically displayed as long as the tester is energized.

The machine control function is accomplished by IC2 in FIG. 1c. The machine has four states namely Off, Reset, Run and Display. The Off state occurs when the test switch S1 is not depressed. The Reset state occurs when the test switch or key is depressed and lasts for nearly 2 milliseconds with this particular embodiment. During this time the counter/display integrated circuit IC3 is set to zero. The duration of the Reset state is set by the resistor R9, capacitor C8 time constant. The reset pulse sets the NOR gate flip-flop of the integrated circuit IC2 low at pin 21. The circuit is then in the Run state and will generate smoothly increasing voltage across the test leads. The magnitude of this voltage is measured by the analog to digital converter and the number representing the voltage is accumulated in the counter. When the arrester under test draws a predetermined current the flip-flop is set high at integrated circuit IC4 pin 4, and the voltage applied to the test leads ceases. The tester is then in the Display state where the firing voltage of the arrester is displayed as a digital number. The tester remains in the Display state until the test key S1 is released.

More specifically, the control flip-flop is set low by the Reset pulse, a logical one at IC2, pin 13. It is set high, thus ending a measurement, by a one at pin 3 if the arrester under test fires. If the firing voltage is above the range of the specific tester, 999 volts here, the counter overflows and sets the flip-flop high by a one at pin 4. If the arrester on test is defective in some way, such that it will not fire but neither can the tester generate 999 volts across it, a "too much time" circuit sets the flip-flop high by forcing a logical zero at pins 1, 2 and 6 of integrated circuit IC2. A "too much time" signal is generated by charging capacitor C6 until the voltage at pin 6 of IC1 exceeds the reference voltage at pin 7. This circuit also functions as a built-in battery check for if the test leads are left open and the test key is depressed, weak batteries will prevent the high voltage supply from generating 999 volts within the allotted time. Thereupon, a number less than 999 is displayed indicating weak batteries.

As previously stated, the counter/display integrated circuit IC3 counts pulses from the analog digital converter at pin 19. It counts as long as the count enable line, pin 11 of IC3, is low. The counter has digit multiplexing capability built in so that it can drive a multiplexed LED display. IC4 performs a BCD to seven-segment conversion.

The high voltage generator uses a step-up, fly-back transformer T1, half wave rectifier combination to generate a voltage ramp which smoothly increases from 0 to 1,000 volts d.c. in approximately 50 milliseconds. During the running state Q1 is driven by a square wave of approximately 10 kHz frequency. When Q1 is turned off, a pulse of approximately 50 volts appears across its collector and the primary winding of the fly-back transformer. The pulse is increased to greater than 1,000 volts across the secondary winding of the transformer and is rectified by diodes D3 and D4. The voltage across capacitor C2 increases rapidly to greater than 1,000 volts after the test key is pressed. Resistor R5 and capacitor C1 constitute a low pass filter or integrator whereby the voltage applied to the test leads follows a ramp of smoothly increasing voltage. Resistor R4 serves to discharge the circuit completely when it is turned off.

The analog to digital converter makes use of the fact that the voltage to be measured, the voltage applied to the arrester under test, starts at the beginning of the test at zero and increases substantially monotonically in time until the arrester fires. As the voltage increases across the capacitor C1 and test leads, it also appears across capacitor C4 and C5. The voltage across capacitor C5 is applied to the inverting input of the comparator of the integrated circuit IC1. When this voltage applied to pin 4 exceeds the reference voltage applied to pin 5, one volt for example, the output at pin 2 falls causing a second comparator with open collector output to pin 114 to discharge capacitor C5. The delay time through these two comparators is such, approximately 1 microsecond, that they function as a one-shot multivibrator. Resistor R10 and capacitor C10 serve to control the duration of the output pulse which is used to trigger the counter IC3 and represents a one volt increase in the voltage applied to the test leads. The timing of the circuit is such that it takes 200 microseconds or longer to charge up 1 volt across capacitor C5 but less than one microsecond to discharge that volt. Since the R6-C4 time constant is some 60 microseconds, the voltage across capacitor C4 is not affected by the discharge of capacitor C5. Thus, each time the voltage across capacitor C4 increases one volt, the voltage across C5 goes through the cycle of increasing one volt and then being discharged to zero. The number of such cycles is counted by the counter integrated circuit IC3 and represents the voltage across capacitor C4 that in turn equals test lead voltage within one volt. When the arrester under test conducts enough current to develop a logical one across resistor R3, the control flip-flop is set high and the counter ceases to count thereby ending the conversion and measurement process. A set of component values that develop these performance characteristics appears in the following Table I.

TABLE I

| Resistors | Values in Ohms |
|---|---|
| R1 | 1K |
| R2 | 1K |
| R3 | 27K |
| R4 | 10M |
| R5 | 2.2M |
| R6 | 27M |
| R7 | 220K |
| R8 | CW |
| R9 | 220K |
| R10 | 27K |
| R11 - R17 | 270 |
| Capacitors | Values in Microfarads |
| C1 | .01 |
| C2 | .0015 |
| C3 | .50 |
| C4 | .0022 |
| C5 | .0022 |
| C6 | 3.3 |
| C7 | .01 |
| C8 | .01 |
| C9 | .000220 |
| C10 | .0001 |
| Diodes | Types |
| D1 | IN914 |
| D2 | IN914 |
| D3 | IN4007 |
| D4 | IN4007 |
| Transistors | Types |
| Q1 | 2N6038 |
| Q2 | 2N5485 |
| Q3 | 2N4403 |
| Q4 | 2N4403 |
| Q5 | 2N4403 |
| Integrated Circuits | Identification |
| IC1 | MC 3302P (Motorola) |
| IC2 | MC 14025CP (Motorola) |
| IC3 | MC 14553CP (Motorola) |
| IC4 | MC 14511CP (Motorola) |
| IC5 | HP 5082-7433 (Hewlett-Packard) |
| Transformers | Turns |
| T1 | 17/400 |

TABLE I-continued

| Batteries | Type |
|---|---|
| B1 - B4 | AA Cells |

It should be understood that the just described embodiment merely illustrate principles of the invention in one preferred form. Many modifications, additions, deletions, and change in values may, of course, be made thereto without departure from the spirit and scope of the invention as set forth in the following claims.

I claim:

1. An electrical surge arrester tester comprising two surge arrester test leads; voltage generating means for generating and applying d.c. voltages of continuously increasing magnitudes to said surge arrester test leads; monitoring means for continuously and simultaneously monitoring the continuously increasing magnitudes of d.c. voltage being applied to and the current being conducted across said surge arrester test leads; counter means for digitally recording the firing voltage monitored by said monitoring means when the current monitored by said monitoring means exceeds a preselected magnitude; means for terminating the the application of voltage by said voltage generating means to said test leads upon recording by said counter means of said firing voltage; and display means for displaying the digitally recorded firing voltage.

2. An electrical surge arrester tester in accordance with claim 1 wherein said voltage generating means comprises a storage capacitor coupled across said surge arrester test leads through a low pass filter circuit of preselected cutoff frequency, and means for pulsing said storage capacitor and said low pass filter circuit with d.c. pulses at a frequency below said cutoff frequency.

3. An electrical surge arrester tester in accordance with claim 2 wherein said low pass filter comprises a shunt capacitor coupled across said surge arrester test leads and a resistor coupling said storage capacitor with said shunt capacitor.

4. An electrical surge arrester tester in accordance with claim 1 wherein said monitoring means comprises two capacitors serially connected across said surge arrester test leads, and means for successively discharging one of said two capacitors as voltage across said test leads and the other of said two capacitors is continuously increased by said voltage generating means.

5. An electrical surge arrester tester in accordance with claim 4 wherein said discharge means comprises a one-shot multivibrator having output leads coupled with said counter means.

6. A method of testing an electrical surge arrester comprising the steps of:
   a. applying voltage of continuously increasing magnitudes to a surge arrester;
   b. monitoring the continuously increasing magnitudes of voltage being applied to the surge arrester while simultaneously monitoring the magnitude of current being conducted therethrough;
   c. sequentially entering the monitored increasing magnitudes of voltage into a digital memory;
   d. detecting a surge of current through the surge arrester and in response thereto reducing the magnitude of voltage being applied to the surge arrester; and
   e. displaying the voltage entered into the digital memory when the surge of current is detected through the surge arrester.

7. A method of testing an electrical surge arrester in accordance with claim 6 wherein step (a) d.c. voltage of continuously increasing magnitude is applied to the surge arrester.

8. A method of testing an electrical surge arrester in accordance with claim 6 wherein step (d) a single surge of current is detected through the surge arrester and in response thereto the magnitude of voltage being applied to the surge arrester is reduced.

9. A method of testing an electrical surge arrester in accordance with claim 7 wherein response to detection of a surge of current in step (d) application of voltage to the surge arrester is terminated.

* * * * *